United States Patent
Truong et al.

(10) Patent No.: US 8,527,854 B2
(45) Date of Patent: Sep. 3, 2013

(54) ERROR DETECTION MODULE, AND ERROR CORRECTION DEVICE INCLUDING THE SAME

(75) Inventors: Trieu-Kien Truong, Dashu Township (TW); Tsung-Ching Lin, Kaohsiung (TW); Hsin-Chiu Chang, Dashu Township (TW); Hung-Peng Lee, Dashu Township (TW)

(73) Assignee: I Shou University, Kaohsiung County (TW)

( * ) Notice: Subject to any disclaimer, the term of this patent is extended or adjusted under 35 U.S.C. 154(b) by 250 days.

(21) Appl. No.: 12/901,951

(22) Filed: Oct. 11, 2010

(65) Prior Publication Data

US 2011/0276862 A1    Nov. 10, 2011

(30) Foreign Application Priority Data

May 7, 2010  (TW) .............................. 99114648 A

(51) Int. Cl.
*H03M 13/00*   (2006.01)

(52) U.S. Cl.
USPC ........... 714/785; 714/776; 714/781; 714/784; 714/792

(58) Field of Classification Search
USPC .................... 714/776, 781, 784, 792
See application file for complete search history.

(56) References Cited

U.S. PATENT DOCUMENTS

| | | | | |
|---|---|---|---|---|
| 3,588,819 A | * | 6/1971 | Tong | 714/787 |
| 2007/0061689 A1 | * | 3/2007 | Park et al. | 714/792 |

* cited by examiner

*Primary Examiner* — Sam Rizk
(74) *Attorney, Agent, or Firm* — Foley & Lardner, LLP

(57) ABSTRACT

An error detection module includes a known-syndrome computing unit, an unknown-syndrome computing unit, and an error detection unit. The known-syndrome computing unit is operable to convert a received signal into a target signal, to obtain known syndromes based upon the target signal, and to generate an errata-locator polynomial based upon an erasure-locator polynomial and the known syndromes. The unknown-syndrome computing unit is operable to compute unknown syndromes based upon the errata-locator polynomial and the known syndromes. The error detection unit is operable to obtain a syndrome set that includes the known syndromes and the unknown syndromes, to obtain an error detection signal according to the syndrome set, and to provide an error correction module coupled thereto with the syndrome set and the error detection signal for enabling the error correction module to correct an error of the received signal.

10 Claims, 1 Drawing Sheet

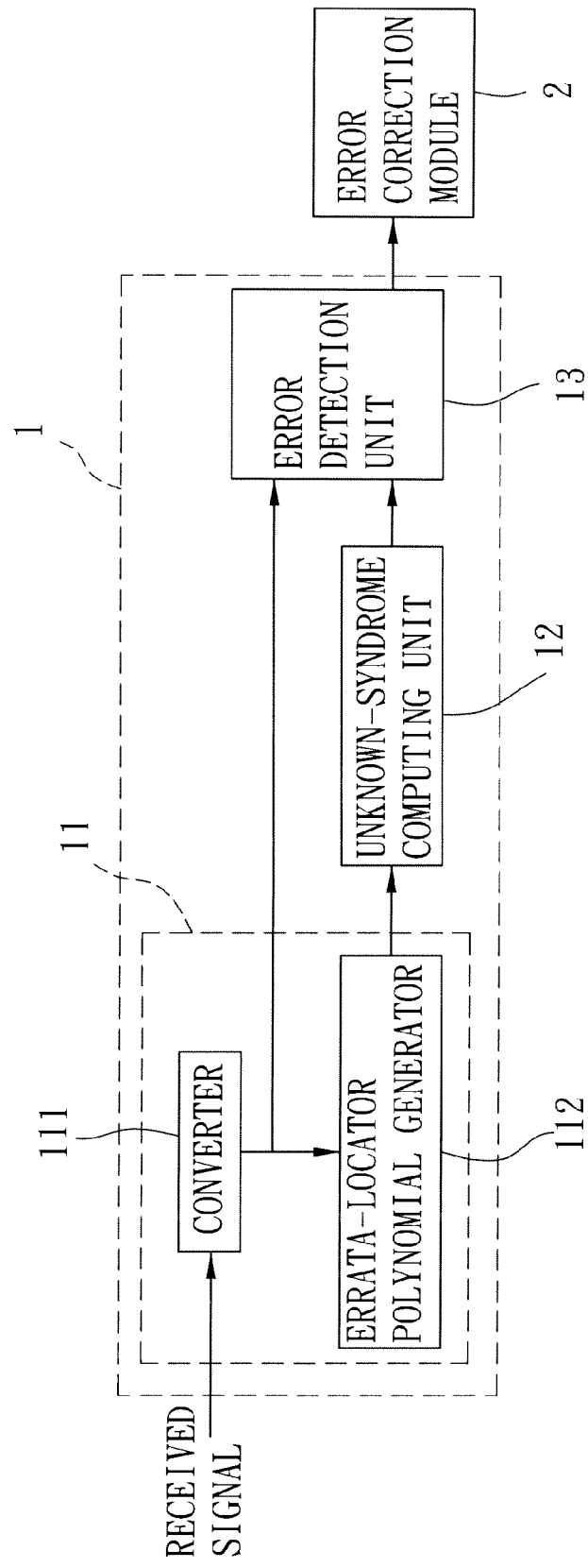

ERROR DETECTION MODULE, AND ERROR CORRECTION DEVICE INCLUDING THE SAME

BACKGROUND OF THE INVENTION

1. Field of the Invention

The present invention relates to an error correction device, more particularly to an error correction device for cyclic codes.

2. Description of the Related Art

Reed-Solomon (RS) codes are generally used in communication, optical-disc system, high-definition television, etc. When a transmitter transmits an RS code to a receiver, a received signal received by the receiver may have errors and errata due to noise interference during data access and transmission. Therefore, the receiver has to correct the errors and errata of the received signal to thereby obtain original information corresponding to the RS code transmitted by the transmitter.

Before correcting the errors and the errata of the received signal, the receiver has to decode the received signal corresponding to the RS code. Nowadays, many algorithms for decoding the RS code have been proposed. For example, in "Decoding of redundant residue polynomial codes using Euclid's algorithm," *IEEE Trans. On Inf. Theory*, Vol. 34, No. 5, pages 1351-1354, September 1988, A. Shiozaki uses the Chinese remainder theorem together with the Euclidean algorithm so as to develop an algorithm for decoding RS codes. However, in view of the complexity of this algorithm, the rate of decoding is relatively slow.

S. V. Fedorenko proposed deriving Gao's algorithm from the Welch-Berlekamp algorithm and the Euclidean algorithm for decoding RS codes in "A simple algorithm for decoding Reed-Solomon codes and its relation to the Welch-Berlekamp algorithm," *IEEE Trans. On Inf. Theory*, Vol. 51, No. 3, pages 1196-1198, March 2005. Recently, in "Simplified procedure for decoding nonsystematic Reed-Solomon codes over GF($2^m$) using Euclid's algorithm and the fast Fourier transform," *IEEE Trans. On Commun.*, May 2009, T. C. Lin et al. proposed that Gao's algorithm may be extended to correct erasures as well as errors by replacing the initial conditions of the Euclidean algorithm by the erasure-locator polynomial and errata interpolating polynomial. However, use of interpolation substantially increases complexity of the algorithm for decoding RS codes, and thus significantly slows down the rate of decoding.

SUMMARY OF THE INVENTION

Therefore, an object of the present invention is to provide an error correction device capable of increasing the rate of decoding cyclic codes.

Accordingly, an error correction device of the present invention is adapted for correcting an error of a received signal received thereby. Erasure positions of the received signal are represented by an erasure-locator polynomial. The error correction device comprises an error detection module and an error correction module.

The error detect ion module includes a known-syndrome computing unit, an unknown-syndrome computing unit, and an error detection unit.

The known-syndrome computing unit has a converter adapted to receive the received signal, and an errata-locator polynomial generator operatively coupled to the converter. The converter is operable to convert the received signal into a target signal, and to obtain a plurality of known syndromes based upon the target signal. The errata-locator polynomial generator is operable to generate an errata-locator polynomial based upon the erasure-locator polynomial and the known syndromes. The unknown-syndrome computing unit is operatively coupled to the known-syndrome computing unit, and is operable to compute a plurality of unknown syndromes based upon the errata-locator polynomial and the known syndromes. The error detection unit is operatively coupled to the known-syndrome computing unit and the unknown-syndrome computing unit. The error detection unit is operable to obtain a syndrome set including the known syndromes and the unknown syndromes, and to obtain an error detection signal according to the syndrome set.

The error correction module operatively is coupled to the error detection module so as to receive the syndrome set and the error detection signal therefrom. The error correction module is operable to correct the error of the received signal according to the syndrome set and the error detection signal.

Another object of the present invention is to provide an error detection module adapted for use in the above-mentioned error correction device according to the present invention.

According to another aspect of this invention, an error detection module is adapted to be coupled to an error correction module for providing the error correction module with a syndrome set and an error detection signal for enabling the error correction module to correct an error of a received signal received by the error detection module. Erasure positions of the received signal are represented by an erasure-locator polynomial. The error detection module comprises a known-syndrome computing unit, an unknown-syndrome computing unit, and an error detection unit.

The known-syndrome computing unit includes a converter and an errata-locator polynomial generator. The converter is adapted to receive the received signal, and is operable to convert the received signal into a target signal, and to obtain a plurality of known syndromes based upon the target signal. The errata-locator polynomial generator is operatively coupled to the convertor, and is operable to generate an errata-locator polynomial based upon the erasure-locator polynomial and the known syndromes.

The unknown-syndrome computing unit is operatively coupled to the known-syndrome computing unit, and is operable to compute a plurality of unknown syndromes based upon the errata-locator polynomial and the known syndromes. The error detection unit is operatively coupled to the known-syndrome computing unit and the unknown-syndrome computing unit. The error detection unit is operable to obtain the syndrome set that includes the known syndromes and the unknown syndromes, to obtain the error detection signal according to the syndrome set, and to provide the error correction module with the syndrome set and the error detection signal obtained thereby.

BRIEF DESCRIPTION OF THE DRAWING

Other features and advantages of the present invention will become apparent in the following detailed description of the preferred embodiment with reference to the accompanying drawing, of which:

FIG. 1 is a block diagram illustrating a preferred embodiment of an error correction device according to the present invention.

DETAILED DESCRIPTION OF THE PREFERRED EMBODIMENT

Before transmission, an original message signal is encoded based upon a generator polynomial G(x) to generate a (n, k, d)

cyclic codeword (e.g., Reed-Solomon code), wherein n is a length of the cyclic codeword, k is a message length of the original message signal, and d is a Hamming distance of the cyclic codeword. A message polynomial of the cyclic codeword may be defined as $$M(x) = \sum_{i=0}^{k-1} m_i x_i. \quad (1)$$

Further, the cyclic codeword may be written as a codeword vector $$c=(c_0, c_1, \ldots, c_{n-1}). \quad (2)$$

Then, components $c_0$ to $c_{n-1}$ can be computed based upon $$c_j = M(\alpha^j) \text{ for } 0 \leq j \leq n-1, \quad (3)$$

where $\alpha$ is an $n^{th}$ root of unity in a finite field, i.e., Galois Field GF($2^m$).

For instance, a communication system includes a sending end and a receiving end. The sending end is configured to generate a message vector m consisting of information and zeros, that is to say, $$m=\{m_0, m_1, m_2, \ldots, m_{k-1}, m_k, m_{k+1}, \ldots, m_{n-1}\}, \quad (3)$$

where $m_0$ to $m_{k-1}$ are assigned to be information symbols, and $m_k$ to $m_{n-1}$ are assigned to be syndrome symbols and are assumed to be zero.

Then, the components $c_j$ of the cyclic codeword c can be computed based upon the inverse fast Fourier transform of the message vector m over the finite field GF($2^m$) as follows, $$c_j = \frac{1}{n} \cdot \sum_{i=0}^{n-1} m_i \cdot \alpha^{-ij} = \sum_{i=0}^{n-1} m_i \cdot \alpha^{-ij} = M(\alpha^{-j}). \quad (4)$$

Subsequently, the sending end is configured to send the cyclic codeword c via a transmission channel to result in a received signal r received by the receiving end. Since the cyclic codeword c may be corrupted by noise interference during transmission through the transmission channel, the received signal r may consist of an error signal e=($e_0$, $e_1$, ..., $e_{n-1}$), an erasure signal $\mu$=($\mu_0, \mu_1, \ldots, \mu_{n-1}$), and the cyclic codeword c. Thus, the received signal r would not be exactly the same as the original message signal. An errata signal is defined as $$\tilde{\mu}=\mu+e=(\tilde{\mu}_0, \tilde{\mu}_1, \ldots, \tilde{\mu}_{n-1}). \quad (5)$$

Accordingly, the received signal may be defined as $$r=c+\tilde{\mu}=(r_0, r_1, \ldots, r_{n-1}). \quad (6)$$

Further, an erasure-locator polynomial $\Lambda(x)$, an error-locator polynomial $W(x)$, and an errata-locator polynomial $\tau(x)$ are defined as follows, $$\Lambda(x) = \prod_{j=1}^{s}(1-Z_j x) = \sum_{j=0}^{s} \Lambda_j x^j, \quad (7)$$

$$W(x) = \prod_{j=1}^{v}(1-X_j x) = \sum_{j=0}^{v} W_j x^j, \text{ and} \quad (8)$$

$$\tau(x) = \Lambda(x) \cdot W(x) = \prod_{j=1}^{v+s}(1-\tilde{X}_j x) = \sum_{j=0}^{v+s} \tau_j x^j, \quad (9)$$

where $\Lambda_0 = W_0 = 1$, $Z_j$ is an erasure position in the erasure signal $\mu$, $X_j$ is an error position in the error signal e, and $\tilde{X}_j$ is either a $j^{th}$ erasure or a $j^{th}$ error position.

Referring to FIG. 1, a preferred embodiment of an error correction device according to this invention is adapted for correcting errors of a received signal r received thereby, and includes an error detection module 1 and an error correction module 2. The error detection module 1 includes a known-syndrome computing unit 11, an unknown-syndrome computing unit 12, and an error detection unit 13.

The known-syndrome computing unit 11 is adapted to receive the received signal r, and to obtain a plurality of known syndromes according to the received signal r. In particular, an $i^{th}$ syndrome $S_i$ associated with a respective index i of the error signal e is defined as $e(\beta^i)$, where $\beta^i$ is a primitive root of the generator polynomial G(x). The known-syndrome computing unit 11 consists of a converter 111, and an errata-locator polynomial generator 112 operatively coupled to the converter 111.

The converter 111 is adapted to receive the received signal r, and is operable to convert the received signal into a target signal a=($a_0, a_1, \ldots, a_{n-1}$) based upon the following Equation (10).

$$a_i = \sum_{j=0}^{n-1} r_j \cdot \alpha^{i \cdot j} = \sum_{j=0}^{n-1}(c_j + \tilde{\mu}_j) \cdot \alpha^{i \cdot j} \text{ for } 0 \leq i \leq n-1 \quad (10)$$

Hence, based upon the target signal a, the converter 111 is further operable to obtain a number (d−1) of known syndromes as $S_i = a_i$, for $1 \leq i \leq d-1$.

Then, the errata-locator polynomial generator 112 is operable to generate the errata-locator polynomial $\tau(x)$ based upon the erasure-locator polynomial $\Lambda(x)$ and the known syndromes $S_1$ to $S_{d-1}$. In "Implementation of Berlekamp Massey algorithm without inversion," *Proc. IEE*, Vol. 138, No. 3, pages 138-140, January 1991, and "VLSI design of inverse-free Berlekamp-Massey algorithm," *Proc. Inst. Elect. Eng.*, Vol. 138, pages 295-298, September 1991, there is disclosed an inverse-free Berlekamp-Massey (BM) algorithm for computing the errata-locator polynomial $\tau(x)$. In the inverse-free BM algorithm, Forney syndromes are defined as follows $$T_k = \sum_{j=0}^{s} \Lambda_j S_{k+s-j} \text{ for } 1 \leq k \leq d-1-s. \quad (11)$$

Accordingly, the errata-locator polynomial $\tau(x)$ may be directly determined by use of the inverse-free BM algorithm initialized with the erasure-locator polynomial $\Lambda(x)$. Since methods for determining the errata-locator polynomial $\tau(x)$ are disclosed in the foregoing documents, details thereof will be omitted herein for the sake of brevity.

The unknown-syndrome computing unit 12 is operatively coupled to the known-syndrome computing unit 11, and is operable to obtain a plurality of unknown syndromes based upon the errata-locator polynomial $\tau(x)$ and the known syndromes $S_1$ to $S_{d-1}$. In particular, the unknown-syndrome computing unit 12 is operable to compute the unknown syndromes based upon $$S_i = \tau_1 S_{i-1} + \tau_2 S_{i-2} + \ldots + \tau_{v+s} S_{i-(v+s)}, \quad (12)$$

where $S_d$ to $S_n$ are the unknown syndromes, $\tau_1$ to $\tau_{v+s}$ are coefficients of the errata-locator polynomial $\tau(x)$, $v$ is a number of errors in the received signal, and s is a number of erasures in the received signal. The coefficients $\tau_1$ to $\tau_{v+s}$ can be obtained from the errata-locator polynomial $\tau(x)$, and then the unknown-syndrome computing unit 12 is operable to compute the unknown syndromes $S_d$ to $S_n$ by means of recursion of Equation (12).

The error detection unit 13 is operatively coupled to the known-syndrome computing unit 11 and the unknown-syndrome computing unit 12, and is operable to obtain a syndrome set $S=\{S_0, S_1, S_2, \ldots, S_{n-1}\}$. The syndrome set S includes the known syndromes $S_1$ to $S_{d-1}$ and the unknown syndromes $S_d$ to $S_n = S_0$. The error detection unit 13 is further operable to generate an error detection signal according to the syndrome set S. The error correction module 2 is operatively coupled to the error detection unit 13 so as to receive the syndrome set S and the error detection signal therefrom, and is operable to correct the errors of the received signal r according to the syndrome set S and the error detection signal.

In detail, when all of the syndromes $S_0$ to $S_{n-1}$ in the syndrome set S are equal to 0, this means that the received signal r does not include the error signal e and the erasure signal $\mu$. Thus, the error detection unit 13 is operable to provide the error correction module 2 with the error detection signal indicating that the received signal r only includes the cyclic codeword c corresponding to the original message signal. That is to say, the cyclic codeword c is not corrupted by interference during transmission, and thus the received signal does not require correction.

On the other hand, when any of the syndromes $S_0$ to $S_{n-1}$ in the syndrome set S is not equal to 0, this means that the received signal r includes at least one of the error signal e and the erasure signal $\mu$. Accordingly, the error detection unit 13 is operable to provide the error correction module 2 with the error detection signal indicating that the received signal r does not only include the cyclic codeword c and fails to correspond to the original message signal. Further, the error detection unit 13 is operable to send the syndrome set S and the target signal a to the error correction module 2.

In response to the error detection signal indicating that the received signal r fails to correspond to the original message signal, the error correction module 2 is operable to compute the message vector m so as to correct the errors of the received signal r based upon the following Equation (13).

$$m_i = a_i - S_i \text{ for } 0 \leq i \leq n-1 \quad (13)$$

The following example is provided for illustrating the operation of the error correction device of this embodiment.

Regarding a (7, 4, 4) cyclic codeword, the length of the cyclic codeword is equal to 7, the message length of the original message signal is equal to 4, and the Hamming distance of the cyclic codeword is equal to 4. It is assumed that the message polynomial of the cyclic codeword is $M(x) = \alpha^4 x^3 + \alpha x^4 + \alpha^2 x^5 + \alpha^5 x^6$, and the message vector $m = (\alpha^4, 0, 0, 0, \alpha, \alpha^2, \alpha^5)$. Therefore, according to Equation (4), the codeword vector corresponding to the cyclic codeword is given by $c = (\alpha^5, \alpha^3, \alpha^3, \alpha^6, \alpha^2, \alpha^4, \alpha^4)$.

It is assumed that the cyclic codeword is corrupted by interference during transmission, and thus the received signal r received by the known-syndrome computing unit 11 is $r = (\alpha^5, 1, \alpha^3, \alpha^6, \alpha^2, \alpha^6, \alpha^4)$. The converter 111 is operable to convert the received signal r to the target signal $a = (\alpha^5, \alpha^4, \alpha^4, 0, 1, 0, 1)$ based upon Equation (10). Hence, the known syndromes are $S_i = a_i$, for $1 \leq i \leq d-1$, i.e., $S_1 = a_1 = \alpha^4$, $S_2 = a_2 = \alpha^4$, $S_3 = a_3 = 0$. Next, the errata-locator polynomial generator 112 is operable to compute the errata-locator polynomial $\tau(x) = 1 + \alpha^6 x + \alpha^6 x^2$ according to the inverse-free BM algorithm associated with the initial value $\mu^{(0)}(x) = \Lambda(x) = (1 + \alpha^5 x)$.

The unknown-syndrome computing unit 12 is operable to obtain the unknown syndromes $S_i = \alpha^6 S_{i-1} + \alpha^6 S_{i-2}$, for $4 \leq i \leq 7$, based upon Equation (12) and the coefficients of the errata-locator polynomial $\tau(x)$. Therefore, the unknown syndromes can be obtained as $S_4 = \alpha^3$, $S_5 = \alpha^2$, $S_6 = \alpha^4$, and $S_0 = S_7 = 1$. Finally, the error correction module 2 is operable to compute the information and syndrome symbols, $m_0 = \alpha^4$, $m_1 = 0$, $m_2 = 0$, $m_3 = 0$, $m_4 = \alpha$, $m_5 = \alpha^2$, and $m_6 = \alpha^5$ based upon Equation (13) so as to correct the errors of the received signal r.

To sum up, the error correction device according to this invention is operable to correct the errors of the received signal r by a method developed from the inverse-free BM algorithm that avoids use of interpolation. Accordingly, the complexity of decoding the cyclic code is decreased and the rate of computing the syndromes is increased to thereby enhance the rate of correction.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

What is claimed is:

1. An error detection module adapted to be coupled to an error correction module for providing the error correction module with a syndrome set and an error detection signal for enabling the error correction module to correct an error of a received signal received by said error detection module, erasure positions of the received signal being represented by an erasure-locator polynomial, said error detection module comprising:
    a known-syndrome computing unit including
        a converter adapted to receive the received signal, said converter being operable to convert the received signal into a target signal, and to obtain a plurality of known syndromes based upon the target signal, and
        an errata-locator polynomial generator operatively coupled to said converter, and operable to generate an errata-locator polynomial based upon the erasure-locator polynomial and the known syndromes;
    an unknown-syndrome computing unit operatively coupled to said known-syndrome computing unit, and operable to compute a plurality of unknown syndromes based upon the errata-locator polynomial and the known syndromes; and
    an error detection unit operatively coupled to said known-syndrome computing unit and said unknown-syndrome computing unit, said error detection unit being operable to obtain the syndrome set that includes the known syndromes and the unknown syndromes, to obtain the error detection signal according to the syndrome set, and to provide the error correction module with the syndrome set and the error detection signal obtained thereby.

2. The error detection module as claimed in claim 1, wherein said converter is operable to convert the received signal into the target signal according to $$a_i = \sum_{j=0}^{n-1} r_j \cdot \alpha^{i \cdot j} = \sum_{j=0}^{n-1} (c_j + \tilde{\mu}_j) \cdot \alpha^{i \cdot j},$$

where α is the target signal, r is the received signal, α is an $n^{th}$ root of unity in a finite field, c is a codeword of an original message signal, ũ is an errata signal, n is a length of a codeword corresponding to the received signal, and $0 \leq i \leq n-1$.

3. The error detection module as claimed in claim 1, wherein said unknown-syndrome computing unit is operable to compute the unknown syndromes according to $$S_i = \tau_1 S_{i-2} + \ldots + \tau_{v+s} S_{i-(v+s)} \text{ for } d \leq i \leq n,$$

where $S_i$ to $S_{d-1}$ are the known syndromes, $\tau_1$ to $\tau_{v+s}$ are coefficients of the errata-locator polynomial, v is a number of errors in the received signal, s is a number of erasures in the received signal, d is a Hamming distance of a codeword corresponding to the received signal, and n is a length of the codeword corresponding to the received signal.

4. The error detection module as claimed in claim 1, wherein said errata-locator generator is operable to generate the errata-locator polynomial using the Berlekamp-Massey algorithm.

5. An error correction device adapted for correcting an error of a received signal received thereby, erasure positions of the received signal being represented by an erasure-locator polynomial, said error correction device comprising:
   an error detection module including:
      a known-syndrome computing unit having a converter adapted to receive the received signal, said converter being operable to convert the received signal into a target signal, and to obtain a plurality of known syndromes based upon the target signal, and
      an errata-locator polynomial generator operatively coupled to said converter, and operable to generate an errata-locator polynomial based upon the erasure-locator polynomial and the known syndromes;
   an unknown-syndrome computing unit operatively coupled to said known-syndrome computing unit, and operable to compute a plurality of unknown syndromes based upon the errata-locator polynomial and the known syndromes; and
   an error detection unit operatively coupled to said known-syndrome computing unit and said unknown-syndrome computing unit, said error detection unit being operable to obtain a syndrome set including the known syndromes and the unknown syndromes, and to obtain an error detection signal according to the syndrome set; and
   an error correction module operatively coupled to said error detection module so as to receive the syndrome set and the error detection signal therefrom, said error correction module being operable to correct the error of the received signal according to the syndrome set and the error detection signal.

6. The error correction device as claimed in claim 5, wherein said converter is operable to convert the received signal into the target signal according to $$a_i = \sum_{j=0}^{n-1} r_j \cdot \alpha^{i \cdot j} = \sum_{j=0}^{n-1} (c_j + \tilde{\mu}_j) \cdot \alpha^{i \cdot j},$$

where α is the target signal, r is the received signal, α is an $n^{th}$ root of unity in a finite field, c is a codeword of an original message signal, ũ is an errata signal, n is a length of a codeword corresponding to the received signal, and $0 \leq i \leq n-1$.

7. The error correction device as claimed in claim 6, wherein said unknown-syndrome computing unit is operable to compute the unknown syndromes according to $$S_i = \tau_1 S_{i-1} + \tau_2 S_{i-2} + \ldots + \tau_{v+s} S_{i-(v+s)} \text{ for } d \leq i \leq n,$$

where $S_i$ to $S_{d-1}$ are the known syndromes, $\tau_1$ to $\tau_{v+s}$ are coefficients of the errata-locator polynomial, v is a number of errors in the received signal, s is a number of erasures in the received signal, and d is a Hamming distance of the codeword corresponding to the received signal.

8. The error correction device as claimed in claim 7, wherein said error correction module is operable to correct the error of the received signal according to $m_i = \alpha_i - S_i$, where $m_i$ is the corrected signal, and $0 \leq i \leq n-1$.

9. The error correction device as claimed in claim 5, wherein said unknown-syndrome computing unit is operable to compute the unknown syndromes according to $$S_i = \tau_1 S_{i-1} + \tau_2 S_{i-2} + \ldots + \tau_{v+s} S_{i-(v+s)} \text{ for } d \leq i \leq n,$$

where $S_i$ to $S_{d-1}$ are the known syndromes, $\tau_1$ to $\tau_{v+s}$ are coefficients of the errata-locator polynomial, v is a number of errors in the received signal, s is a number of erasures in the received signal, d is a Hamming distance of a codeword corresponding to the received signal, and n is a length of the codeword corresponding to the received signal.

10. The error correction device as claimed in claim 5, wherein said errata-locator polynomial generator is operable to generate the errata-locator polynomial using the Berlekamp-Massey algorithm.

* * * * *